US006309241B2

(12) United States Patent
Nagai (10) Patent No.: US 6,309,241 B2
(45) Date of Patent: Oct. 30, 2001

(54) BRANCH CONNECTION STRUCTURE FOR FLAT CABLE

(75) Inventor: Kentaro Nagai, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/754,281

(22) Filed: Jan. 5, 2001

(30) Foreign Application Priority Data

Jan. 26, 2000 (JP) .................................. 12-017442
Jan. 31, 2000 (JP) .................................. 12-022177

(51) Int. Cl.⁷ ..................................... H01R 4/24
(52) U.S. Cl. ............................................ 439/422
(58) Field of Search .................... 439/421, 422, 439/423, 424, 399, 407, 498

(56) References Cited

U.S. PATENT DOCUMENTS 3,703,604 * 11/1972 Henschen et al. .................... 439/422
3,966,295 * 6/1976 Hyland et al. ........................ 439/422
4,065,199 * 12/1977 Andre et al. ......................... 439/422
4,082,402 * 4/1978 Kinkaid et al. ...................... 439/422

FOREIGN PATENT DOCUMENTS 4-359875   12/1992   (JP) .

* cited by examiner

Primary Examiner—Brian Sircus
Assistant Examiner—Phuong K T Dinh
(74) Attorney, Agent, or Firm—Finnegan, Henderson, Farabow, Garrett & Dunner, L.L.P.

(57) ABSTRACT

A branch connection structure includes a flexible flat cable (FFC)(21) and connection terminals (22) attached to the middle of the FFC. The FFC comprises conductive strips (23) arranged in parallel to each other at a predetermined interval, and a pair of insulating films (24) sandwiching the conductive strips. One or more slits (25) extend between any two adjacent conductive strips to define a plurality of separated regions (27) in the middle of the FFC, each region including one of the conductive strips. The connection terminal has conductive teeth (31) and a pair of retainers (30) positioned on both sides of the conductive teeth. The conductive teeth pierce through the conductive strip of the separated region from the rear surface of the FFC, and the tips of the conductive teeth are bent so as to pierce again into the conductive strip from the top surface of the separated region. The retainers firmly hold the separated region at both sides of the conductive teeth without touching the conductive strip, and the FFC is folded back at the terminal connectors.

12 Claims, 8 Drawing Sheets

FIG.1A
RRIOR ART

FIG.1B
RRIOR ART

FIG.1C
RRIOR ART

FIG.2
RRIOR ART

BRANCH CONNECTION STRUCTURE FOR FLAT CABLE

The present patent application claims the benefit of earlier Japanese Patent Applications Nos. 2000-017442 filed Jan. 26, 2000 and 2000-022177 filed Jan. 31, 2000, the disclosures of which are entirely incorporated herein by reference.

BACKGROUND OF THE INVENTION

1. Field of the Invention

The present invention relates to a branch connection structure for a flexible circuit belt, such as a flexible flat cable (FFC) or a flexible printed circuit.

2. Description of the Related Art

In general, a branch connector is used to branch off a flexible circuit belt, such as a flexible flat cable (FCC), and to electrically connect the flexible circuit belt to two or more circuits. Such a branch connector is generally attached to the end of the flat cable. A counterpart connector that is attached to another circuit to be connected receives this branch connector of the flexible circuit belt, thereby making electrical connection between two or more circuits.

Figure 1A:
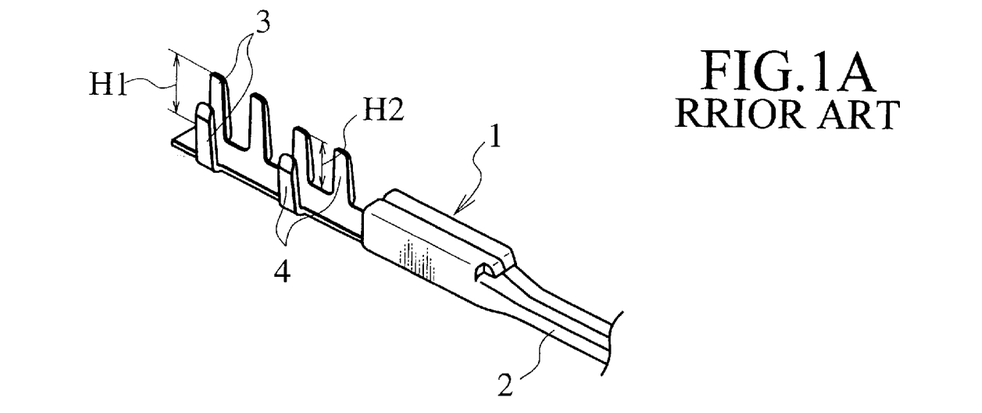
FIG. 1A is a perspective view of a connection terminal.
Figure 1B:
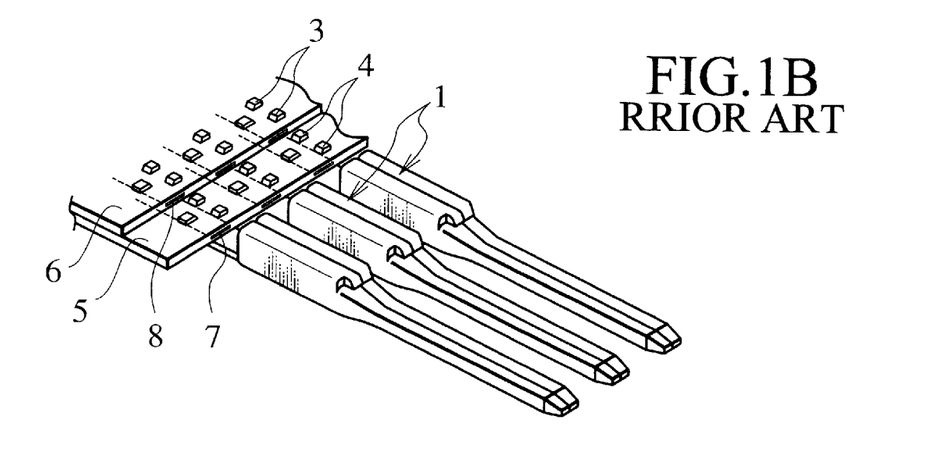
FIG. 1B is a perspective view of a set of connection terminals attached to layered flat cables.
Figure 1C:
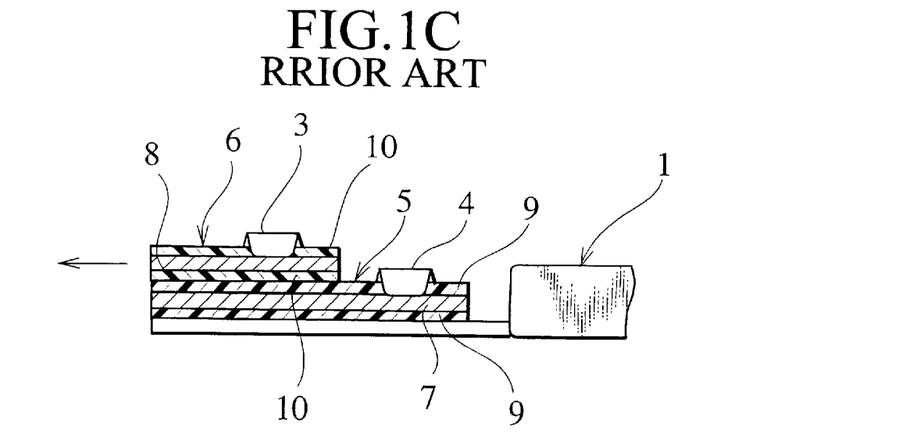
FIG. 1C is a cross-sectional view of the branch connection structure.
Figure 2:
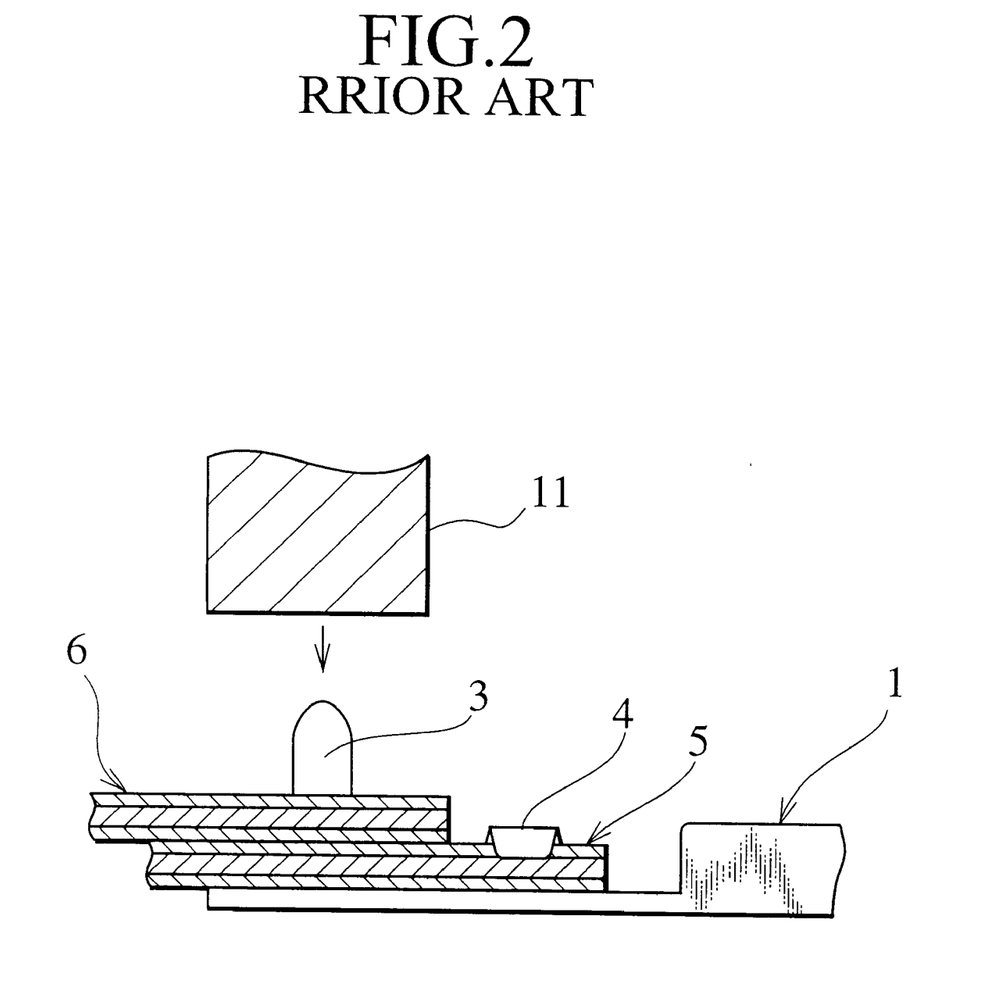
FIG. 2 illustrates how the conventional connection terminal is fixed to the layered flat cables.

FIGS. 1 and 2 illustrate a conventional branch connector for use with a flexible circuit belt. This type of branch connector is disclosed in, for example, Japanese Patent Application Laid-open No. 4-359875.

As shown in FIG. 1, the conventional branch connector consists of one ore more connection terminals 1. The connection terminal 1 has a male contact 2 at the leading end, which is to be received by a female contact of a counterpart connector. The connection terminal 1 also has a tall fork 3 with a height H1 and a shorter fork 4 with a height H2 (H2<H1) near the trailing end.

FIGS. 1B and 1C show how a set of connection terminals 1 are attached to the end of a flexible circuit belt, which consists of two flexible flat cables 5 and 6. The connection terminals 1 are arranged in parallel to each other. A flexible flat cable 6 is superimposed on the FFC 5 so that the leading edge of the upper FFC 6 recedes from the leading edge of the FFC 6 by a prescribed distance. The forks 3 and 4 of each connection terminal 1 pierce through the superimposed flat cables 5 and 6, and the tips of the forks 3 and 4 are folded back in order to tightly hold the flat cables 5 and 6 together. In this manner, electrical connection between the flat cables and the connection terminals 1 are guaranteed.

To be more precise, the lower layer flexible flat cable 5 is held by the shorter fork 4, and the upper layer flexible flat cable 6 are held together with the FFC 5 by the taller fork 3.

The lower flexible flat cable 5 comprises a conductive layer 7 and a pair of insulating films 9 sandwiching the conductive layer 7, as shown in FIG. 1C. The upper flexible flat cable 6 comprises a conductive layer 8 and a pair of insulating films 10 sandwiching the conductive layer 8.

To complete a branch connection of the layered flat cables 5 and 6 (i.e., a flexible circuit belt) by the conventional connection terminals 1, the shorter fork 4 first pierces the lower flat cable 5. The tips of the fork 4 are bent using a piercing tool so that the tips stick into the conductive layer 7 of the lower flat cable 5. The flexible flat cable 6 is superimposed over the flexible flat cable 5 with its leading edge receding from the leading edge of the lower flat cable 5. At this time, the taller fork 3 pierces the upper flat cable 6, as shown in FIG. 2. The tips of the fork 3 are also bent using a piercing tool so that the tips stick into the conductive layer 8 of the upper flat cable 6.

With the conventional connection terminal 1, the piercing and bending steps have to be repeated twice. If three of more flat cables are piled, the same steps must be repeated as many times as the number of cable layers. The branch connection using the conventional connection terminals is time-consuming and requires much labor.

Another problem in the branch connection using the conventional connection terminal 1 is that the upper flexible flat cable 6 is stretched under a high tension when the branch connection assembly is applied to, for example, a wire harness device. A tensile stress is applied to the fork 3, which is pressing the upper flat cable 6 for electric connection, when the wire harness device is installed in an automobile door. As a result, the fork 3 deforms, which may cause the contact resistance to increase.

SUMMARY OF THE INVENTION

The present invention was conceived in order to overcome these problems in the prior art technique, and it is an object of the invention to provide a branch connection structure for a flexible circuit belt, which has a high durability and can achieve a reliable electric connection.

To achieve the objects, a branch connection structure includes a flexible circuit belt, such as a flexible flat cable (FFC), and a plurality of connection terminals attached to the middle portion of the flexible circuit belt. The flexible circuit belt comprises a plurality of conductive strips arranged in parallel to each other at a predetermined interval, and a pair of insulating films sandwiching the conductive strips. One or more slits extend between any two adjacent conductive strips and along a middle portion of the conductive strip. The slits define a plurality of separated regions in the middle of the FFC, each region including one of the conductive strips.

Each of the connection terminals has conductive teeth and a pair of bendable retainers positioned on both sides of the conductive teeth. The conductive teeth pierce through the conductive strip of the associated separated region from the rear surface of the flexible circuit belt. The tips of the conductive teeth stick out of the top surface of the separated region, and are bent so as to pierce again into the conductive strip from the top surface of the separated region. The bendable retainers securely hold the separated region at both sides of the conductive teeth without touching the conductive strip. The flexible circuit belt is folded back at the connection terminals.

The bendable retainer has a pair of walls facing each other. The walls are fit into the slits extending on both sides of the associated separated region. The top ends of the walls are bent downward so as to press the top surface of the flexible circuit belt.

The conductive teeth also face each other. The gap between the opposing conductive teeth is narrower than the width of the conductive strip and than the gap between the facing walls of the bendable retainer. This arrangement allows the conductive teeth to pierce through the conductive strip without fail, and allows the retainer to hold the separated region without touching the conductive strip.

With this branch connection structure, electrical connection between the conductive teeth of the connection terminal and the conductive strip of the flexible circuit belt is guaranteed even if a tension is applied to the flexible circuit belt. Since the bendable retainers securely hold the separated region of the flexible belt at both sides of the conductive teeth, any tension or stress applied to the flexible circuit belt does not affect the mechanical connection between the conductive teeth and the conductive strip.

In another aspect of the invention, a branch connection structure that includes a flexible circuit belt (e.g., a flexible flat cable) folded in double and a plurality of connection terminals attached to the folded portion of the flexible circuit belt is provided. The flexible circuit belt comprises a plurality of conductive strips arranged in parallel to each other at a predetermined interval, an insulating film sandwiching the conductive strips. One or more slits extend between any two adjacent conductive strips and along a middle portion of the conductive strip, and the flexible circuit belt is folded in double at the middle of the slits. The slits define a plurality of doubled branch regions, each region including double conductive strip.

Each of the connection terminals has conductive teeth and a pair of bendable retainers positioned on both sides of the conductive teeth. The conductive teeth pierce through the double conductive strip from the rear face of the branch region. The tips of the conductive teeth sticking out of the top surface of the branch region are bent so as to pierce again into the conductive strip from the top surface of the branch region.

Each retainer has a pair of opposing walls piercing through the insulating film of the branch region, and top ends of the walls are bent so as to press the top surface of the branch region.

This branch connection structure further includes a connector housing having a plurality of cavities. Each branch region and the connection terminal attached to the branch region constitute a branch terminal, and the branch terminal is accommodated in one of the cavities of the connector housing.

This arrangement can also guarantee the electric connection between the conductive teeth of the connection terminal and the conductive strip of the flexible circuit belt.

BRIEF DESCRIPTION OF THE DRAWINGS

Other objects and advantages will be apparent from the following detailed description of the invention in conjunction with the attached drawings, in which:

FIG. 1 illustrates a conventional branch connection structure, in which

DETAILED DESCRIPTION OF THE PREFERRED EMBODIMENTS (First Embodiment)

FIGS. 3 through 6 illustrate a branch connection structure for a flexible circuit belt according to the first embodiment of the invention.

Figure 3:
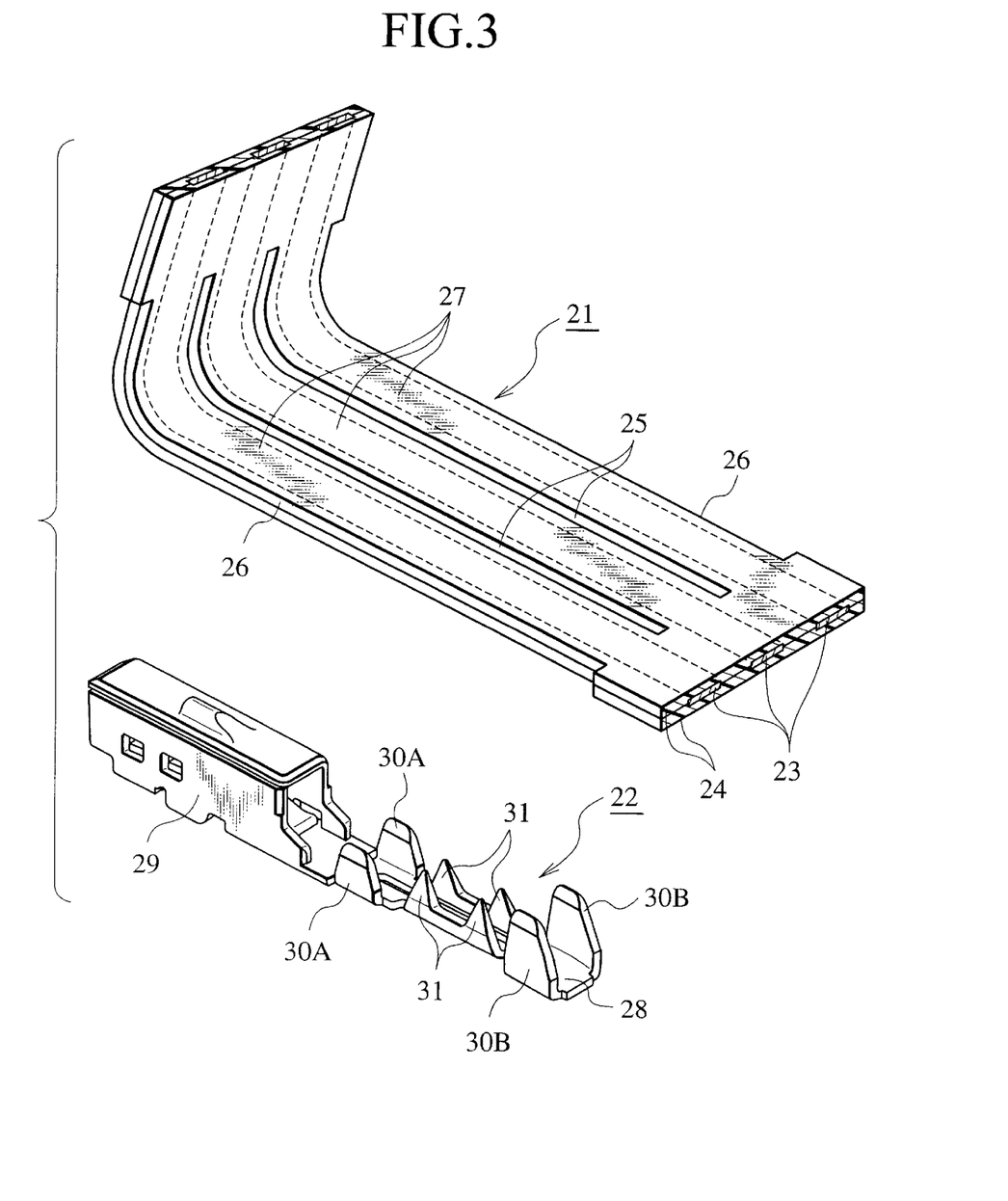
FIG. 3 is an exploded perspective view of a branch connection structure for a flexible flat cable according to the first embodiment of the invention.

The branch connection structure comprises a flexible flat cable (FFC) 21 and multiple connection terminals 22 which are to be fixed to the FFC 21. Each connection terminal 22 is accommodated in an associated cavity of a connector housing (see FIG. 6) after it is fixed to the FFC 21.

The FFC 21 comprises a plurality of conductive strips, such as rolled copper foils, 23 arranged in parallel to each other at a predetermined interval, which are sandwiched by a base film (i.e., an insulating film) 24. The FFC 21 has multiple slits 25, each extending along the longitudinal axis of the FFC 21 and between two adjacent conductive strips 23. The slits 25 are located in the middle area of the FFC 21, and are used to fix the connection terminals 22 to the FFC 21. The FFC 21 has cutouts 26 along its longitudinal edges. Both the slits 25 and the cutouts 26 are formed penetrating through the insulating film 24 so as not to invade the conductive strips 23.

The slits 25 and the cutouts 26 define a plurality of separated regions 27, each region having an independent conductive strip 23 inside. The number of the connection terminals 22 used for branch connection is equal to the number of separated regions 27. The width of each separated region 27 is almost the same as the width of the connection base 28 of the connection terminal 22.

Each connection terminal 22 has a female contact 29 at its leading end, and a base plate 28 extending from the trailing end of the contact. The female contact 29 is a rectangular shell, which is to receive a contact terminal of a counterpart jack attached to another circuit or cable. The female contact 29 and the base plate 28 are monolithically formed when fabricating the connection terminal 22.

The base plate 28 has a pair of bendable retainers 30A and 30B, and conductive teeth 31 between the bendable retainers 30A and 30B. The bendable retainers are slightly taller than the conductive teeth 31. The first bendable retainer 30A is positioned near the female contact 29, and the second bendable retainer 30B is positioned at the trailing end of the connection terminal 22. Each of the bendable retainers 30A and 30B has a pair of walls rising from the longitudinal edges of the base plate 28 and facing each other. The conductive teeth 31 also rise from the longitudinal edges of the base plate 28 so as to face each other.

The gap between the facing conductive teeth 31 is set narrower than the width of the conductive strip 23 of the FFC 21, and narrower than the gap between the facing walls of the bendable retainers 30A and 30B.

To attach a set of connection terminals 22 to the FFC 21, the facing walls of the bendable retainers 30A and 30B of each connection terminal 22 are inserted into in the slits 25 extending along both sides of the associated region 27. Each separated region 27 of the PFC 21 is received between the facing walls of the bendable retainers 30A and 30B. At the same time, the conductive teeth 31 of each connection terminal 22 pierce through the conductive strip 23 of the associated separated region 27, and the tips of the conductive teeth 31 stick out of the top surface of the FFC 21. The first bendable retainer 30A of each connection terminal 22 is positioned almost in the middle of the associated region 27.

Figure 4:
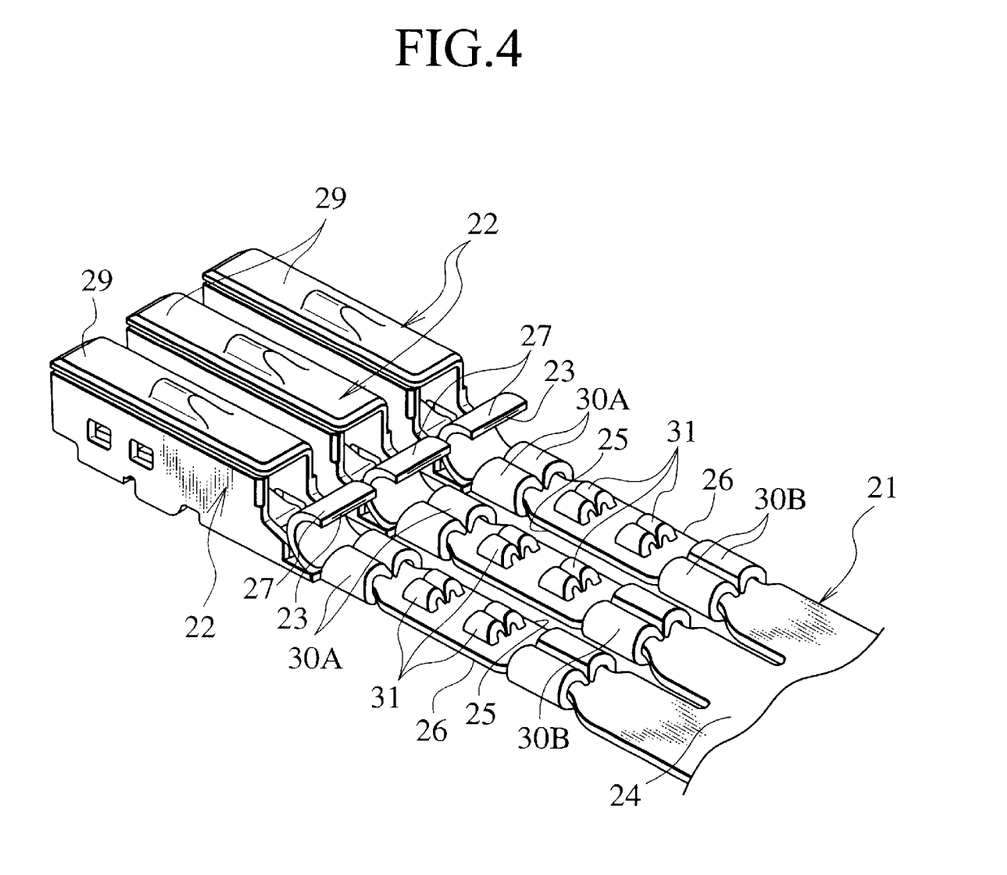
FIG. 4 illustrates the branch connection structure in a perspective view, in which connection terminals are fixed to the flexible flat cable.
Figure 5:
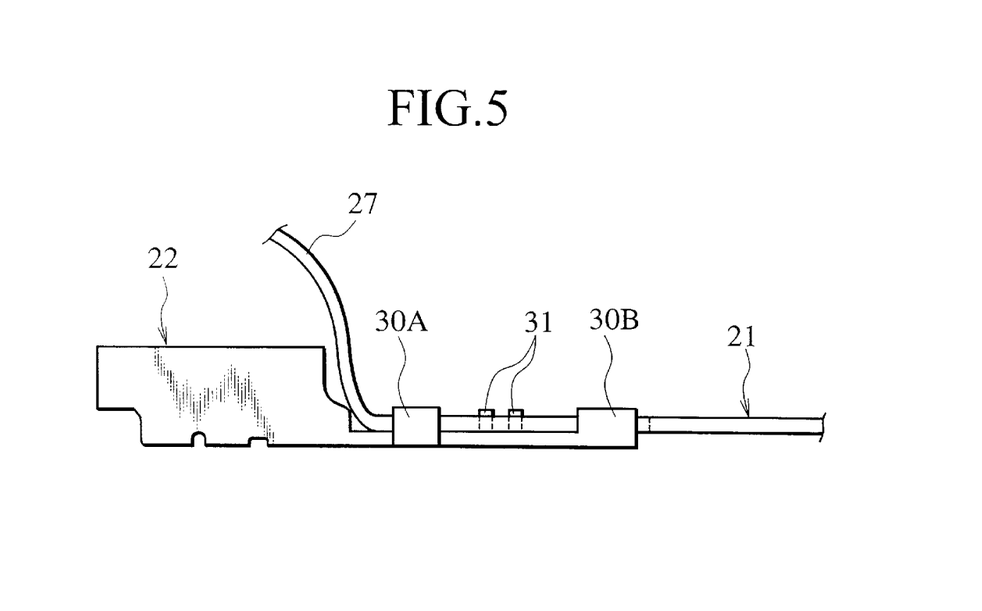
FIG. 5 is a side view of the branch connection structure shown in FIG. 4.

Then, the tips of the conductive teeth 31, and the tops of the facing walls of the bendable retainers 30A and 30B are simultaneously bent inward using, for example, a piercing tool. The piercing tool presses the conductive teeth 31 and the bendable retainers 30A and 30B until the tips of the conductive teeth 31 stick back into the conductive strip 23 of the associated region 27. At this time, the top ends of the facing walls of the bendable retainers 30A and 30B press the top face (i.e., the insulating film 24) of the associated region 27, thereby securely holding the separated region 27. This state is illustrated in FIG. 4.

The conductive teeth 31 function as electrically connecting the connection terminal 22 to the conductive strip 23 of the associated region 27 with the tips piercing through the conductive strip 23 and being bent back sticking again into the conductive film 23. On the other hand, the bendable retainers 30A and 30B firmly hold the separated region 27 of the FFC 21 without contacting the conductive strip 23 on both sides of the conductive teeth 31.

Figure 6:
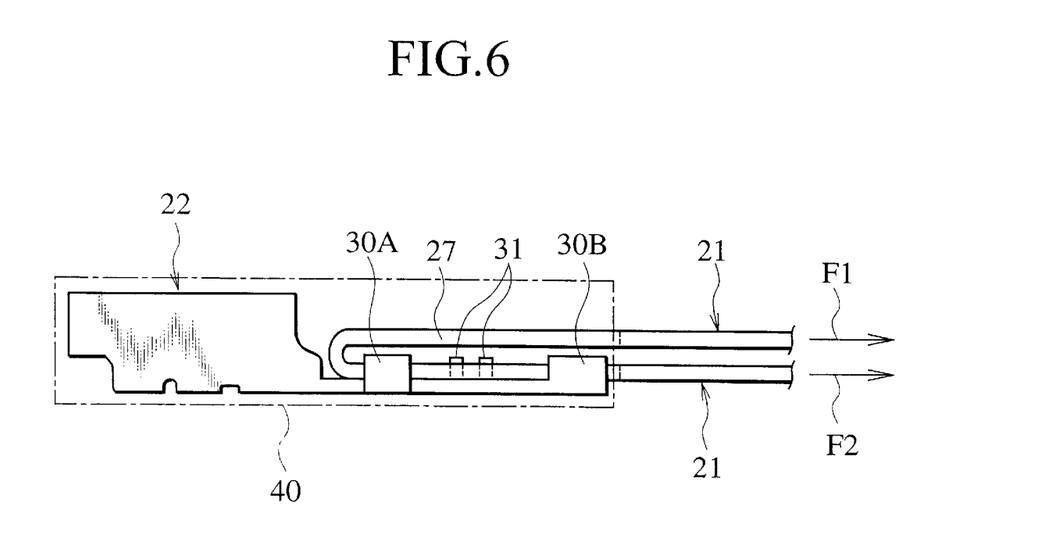
FIG. 6 illustrates the completely assembled state of the branch connection structure, in which the flexible flat cable is folded back at the bendable retainer of the connection terminal.

Then, a half part of the FFC 21 is folded backward at almost 180 degrees, as shown in FIG. 6, using the bendable retainer 30A as a folding fulcrum. The slits 25 facilitate folding the FFC 21. The folded half of the FFC 21 overlies the other half of the FFC 21 positioned directly on the base plate 28 of the connection terminal 22. In this manner, a branch connector that branches out the FFC 21 by the slits 25 is completed. The female contacts 29, which function as branch terminals of the branch connector for the FEC 21, are inserted in the associated cavities of a connector housing 40, as shown in FIG. 6. The female contacts 29 are to receive terminal contacts of a counterpart connector.

In this branch connector structure, electrical connection between the conductive teeth 31 of the connection terminal 22 and the conductive strip 23 of the FFC 21 is guaranteed by the bendable retainers 30A and 30B positioned on both sides of the conductive teeth 31. The retainers 30A and 30B of each connection terminal 22 firmly retain the associated separated region 27 of the FFC 21. Accordingly, even if a tension F1 is applied to the upper FFC 21 in the direction indicated by the arrow F1, the first bendable retainer 30A blocks the tension from adversely affecting the electrical connection between the conductive teeth 31 and the conductive strip 23 of the FFC 21. This means that the electrical connection of the branch connector is guaranteed even if the FFC is pulled strongly.

The same thing applies to the lower FFC 21. If a tension F2 is applied to the lower FFC 21 in the direction indicated by arrow F2, the second bendable retainer 30B block the tension from affecting the electric connection of the conductive teeth 31. Consequently, a durable and reliable branch connector structure is realized. This branch connector structure is applicable to, for example, a wire harness of an automobile.

Another advantage of the branch connector structure of the first embodiment is that the conductive teeth 31 and the bendable retainers 30A and 30B can be bent simultaneously when the set of connection terminals 22 are attached to the FFC 21. The number of steps required to assemble the connection terminals into the FFC 21 is reduced.

(Second Embodiment)

FIGS. 7 through 11 illustrate a branch connection structure according to the second embodiment of the invention. In the second embodiment, the separated regions 27 of the FFC 21 are completed folded in double, and both the upper and the lower layers of the doubled FFC 21 are pierced together by the conductive teeth 31. In addition, the facing walls of the bendable retainers also pierce through the doubled insulating film (or the base film) 24 of the FFC 21, instead of being fit into the slit 25.

Figure 7:
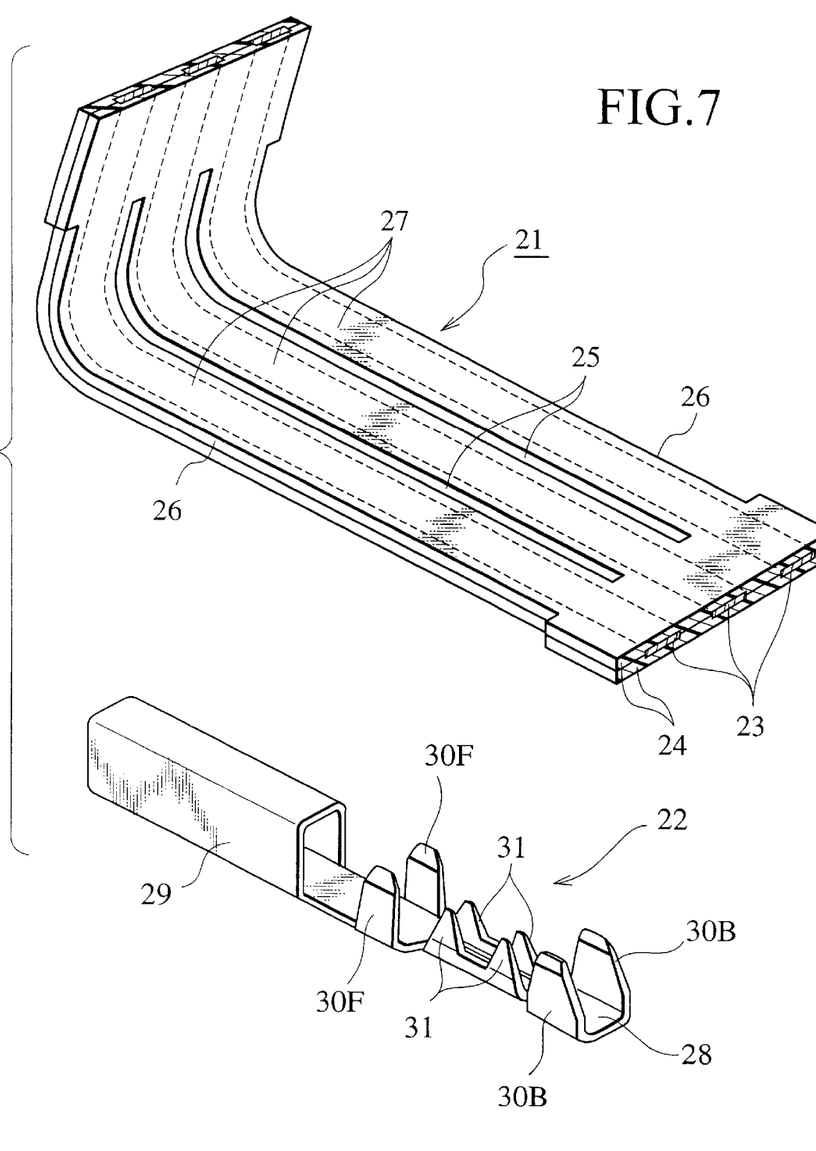
FIG. 7 is an exploded perspective view of a branch connection structure for a flat flexible cable according to the second embodiment of the invention.

As shown in FIG. 7, the branch connection structure comprises a flexible flat cable (FFC) 21, which is an example of a flexible circuit belt, and a set of connection terminals 22 (only a single connection terminal is shown in FIG. 7). The materials and the configuration of the FFC 21 itself are the same as those of the first embodiment, and therefore, the explanation for them will be omitted. The difference from the first embodiment is that the FFC 21 is folded at the middle of the slits. The slits define doubled branch regions, and the upper and the lower layers of the branch region are retained together. This arrangement will be described in more detail below. The same elements are denoted by the same numerical references as those in the first embodiment.

The connection terminal 22 has a female contact 29, which is a rectangular shell positioned at the front end of the leading end of the connection terminal 22. The female contact 29 of the connection terminal 22 is to receive a mail contact of a counterpart connector, which is, for example, a rectangular solid.

A base plate 28 extends from the trailing end of the female contact 29. The width of the base plate 28 is slightly narrower than the width of the separated region 27 having an independent conductive strip 23 inside.

The connection terminal 22 has a pair of bendable retainers 30B and 30F. The first bendable retainer 30F is positioned near the female contact 29. The second bendable retainer 30B is positioned at the remote end of the connection terminal 22. There are conductive teeth 31 positioned between the bendable retainers 30B and 30F. The conductive teeth 31 face each other with the base plate 28 between them. The width of the facing conductive teeth 31 is narrower than the width of the conductive strip 23 of the FFC 23. The conductive teeth 31 pierce through the insulating film 23 and the conductive strip 23 of the FFC 21, so that the tips of the conductive teeth 31 stick out of the top surface of the FFC 21, as in the first embodiment. The tips of the conductive teeth 31 are then bent back so as to stick into the conductive strip 23 again.

Figure 8:
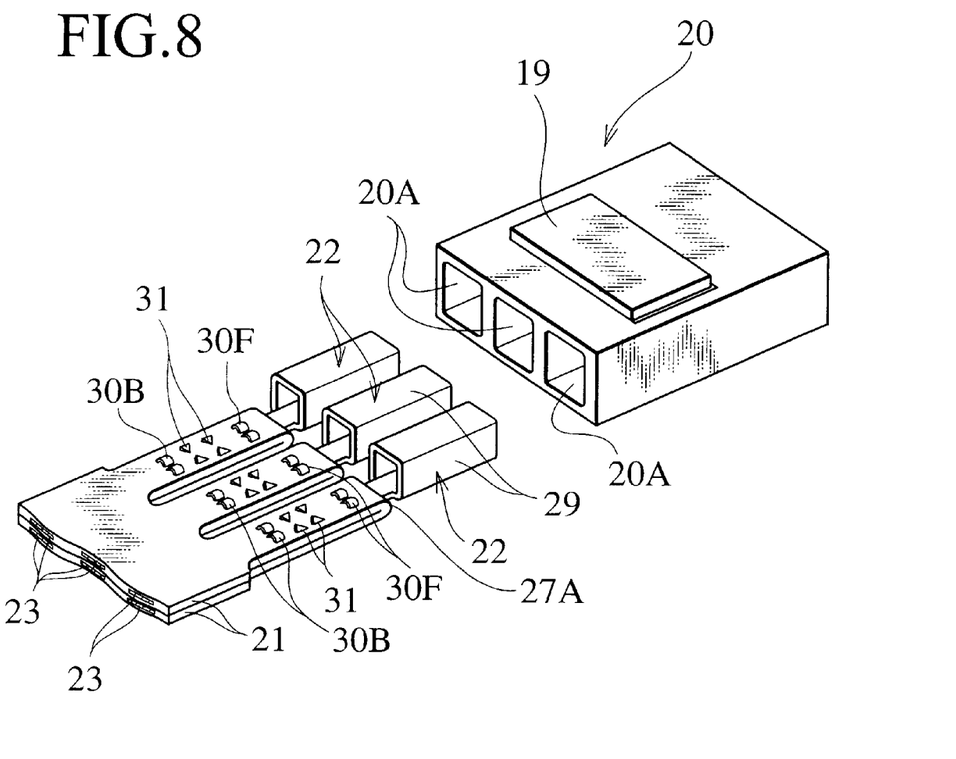
FIG. 8 illustrates the branch connection structure and a connector housing in a perspective, in which multiple connection terminals are fixed to the doubled branch regions of the flexible flat cable.
Figure 9:
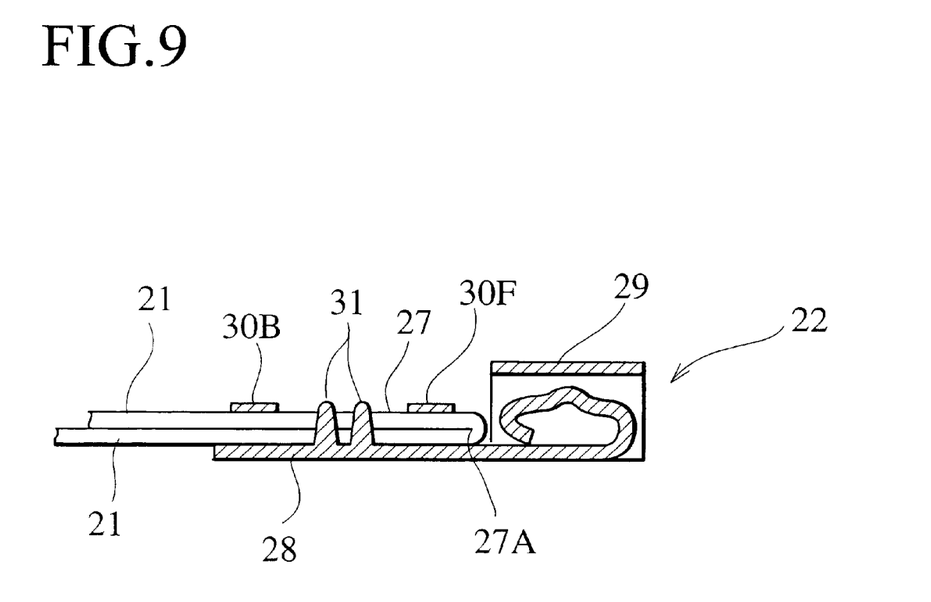
FIG. 9 is a cross-sectional view of a branch terminal of the branch connection structure.

The branch connector structure of the second embodiment has a connector housing 20, as shown in FIG. 8. The connector housing 20 has multiple cavities 20A for accommodating the connection terminals 22 and the separated regions 27 of the FFC 21 fixed to the connection terminals 22. The cavities 20A extend in parallel to each other and throughout the connector housing 20. The connector housing 20 has a clamp 19 for pressing the folded portion 27A of each separated region 27 and for stopping the trailing end of the female contact 29.

In order to assemble the FFC 21 and the connection terminal 22 into a branch connector, the FFC 21 is first folded into layers at the middle of the slit 25 regions. The folded separated regions 27 become the branches of the FFC 21. Multiple connection terminals 22 are used so as to correspond to the layered branches. The base plate 28 of each connection terminal 22 receives one of the layered branches of the FFC 21. At this time, the conductive teeth 31 of the connection terminal 22 pierce through the conductive strips 23 of both the upper and the lower layers of the branch of the FFC 21. The facing walls of the bendable retainers 30F and 30B also pierce through the insulating film (i.e., the base film) 24 of the FFC 21, outside the conductive strip 23. Accordingly, the tips of the conductive teeth 31 and the top ends of the facing walls of the bendable retainers 30B and 30F all stick out of the top surface of the folded FFC 21.

Figure 10:
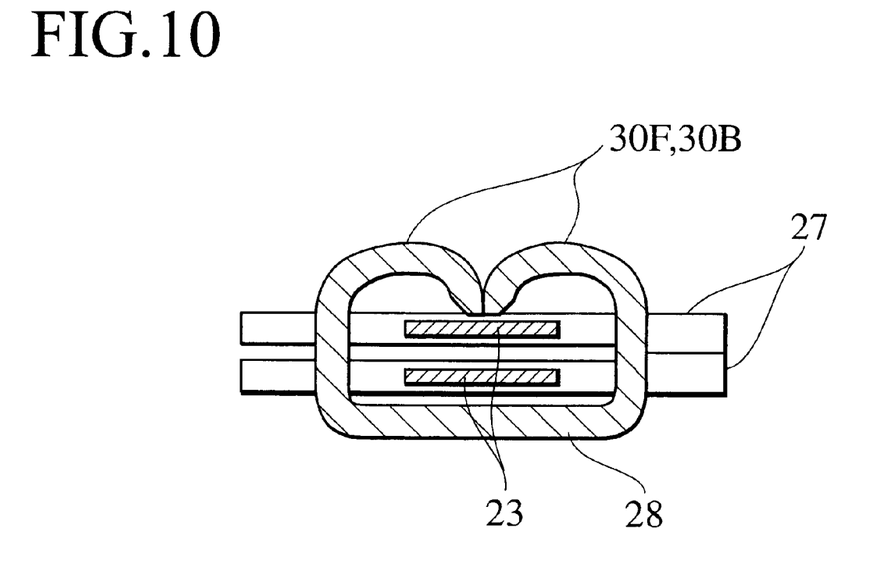
FIG. 10 illustrates how the bendable retainer of the connection terminal of the second embodiment holds the flexible flat cable in a cross-sectional view.
Figure 11:
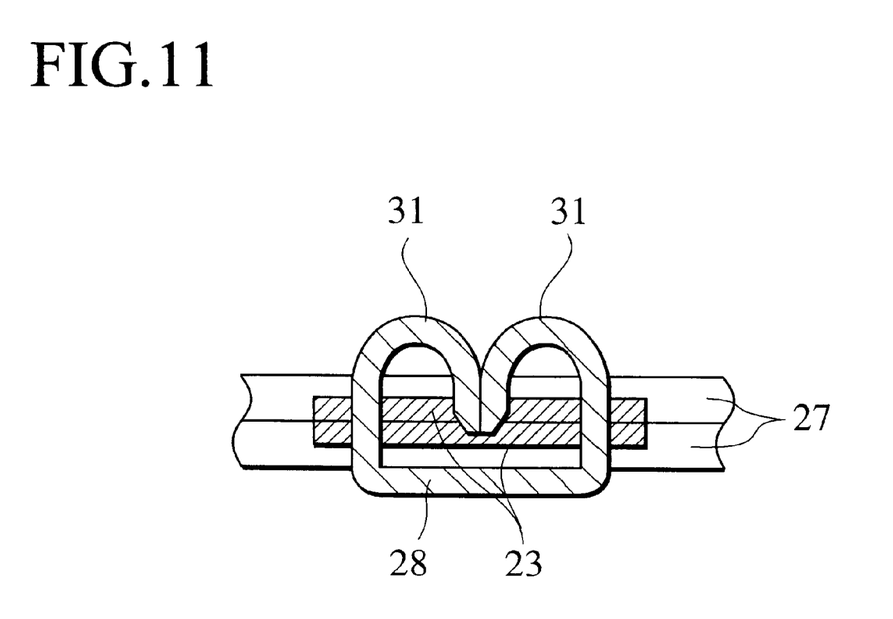
FIG. 11 illustrates how the conductive teeth achieve electric connection with the doubled flexible flat cable in a cross-sectional view.

Then, the tips of the conductive teeth 31, and the top ends of the bendable retainers 30B and 30F are simultaneously bent inward using a piercing tool (not shown). The piercing tool drives the bendable retainers 30B and 30F until their top ends push the top surface of the insulating film 24 of the separated region 27 of the FFC 21, as shown in FIG. 10. The conductive teeth 31 are also driven until their tips stick into the conductive strip 23 of the separated region 27, as shown in FIG. 11.

The bendable retainers 30B and 30F securely hold the associated separated region 27 that constitutes one of the branches. The female contact 29 of the connection terminal 22 attached to the separated region 27 functions as a branch terminal of the branch connector. The conductive teeth 31 guarantee electrical connection between the connection terminal 22 and the FFC 21. As is clearly shown in FIG. 11, the tips of the conductive teeth 31 first pierce the conductive strip 23 from the bottom of the FFC 21 and then stick again into the conductive strip 23 from the top surface of the folded FFC 21.

Then, the female contacts 29 of the connection terminal 22 and the separated region 27 folded and fixed to the connection terminal 22 are inserted in the cavities 20A of the connector housing 20. A female contact 29 and a separated region 27 constitute a branch terminal of the branch connector. A clamp 19 is then inserted into the cavities 20A from the top face of the housing 20 in order to push down the folded portion 27A of the separated region 27. The clamp 19 also abuts against the trailing end of the female contact 29, and prevents the female contact 29 from coming out of the connector housing 20. In this manner, the branch terminals of the FFC 21 are reliably fit into the connector housing 20.

In the branch connector structure of the second embodiment, even if a tension is applied to the FFC 21 when the FFC 21 is pulled strongly, electric connection between the conductive strip 23 of the FFC 21 and the conductive teeth 31 of the connection terminal 22 is not affected. This is because the bendable retainers 30B and 30F firmly retain the doubled FFC 21 at both sides of the conductive teeth 31. The retainer 30F positioned near the female contact 29 presses the folded portion 27A of the separated region 27, which allows the branch terminal (consisting of the female contact 29 and the separated region 27) to be smoothly inserted into the cavity 20A of the connector housing 20. Accordingly, the work efficiency in assembling the branch connector is improved.

As in the first embodiment, the conductive teeth 31 and the bendable retainers 30B and 30F are bent at a time using a piercing tool, and the number of manufacturing steps is reduced.

Although the present invention has been described based on the preferred embodiments, the invention is not limited to these examples, and there are many changes and substitutions without departing from the present invention. For example, the flexible flat cable is used as a flexible circuit belt in the embodiments; however, a flexible printed circuit (FPC) may be applied to the branch connector structure of the invention. The female contact of each connection terminal may be replaced by a male contact. Such substitutions are intended to be included in the scope of the invention defined by the appended claims.

What is claimed is:

1. A branch connection structure for a flexible circuit belt comprising:
    a flexible circuit belt having a plurality of conductive strips arranged in parallel to each other at a predetermined interval, a pair of insulating films sandwiching the conductive strips, and a plurality of slits extending between any two adjacent conductive strips and along middle portions of the conductive strips, the slits defining a plurality of separated regions in a middle of the flexible circuit belt, each region including one of the conductive strip; and
    a plurality of connection terminals, each attached to one of the separated region, each connection terminal having conductive teeth and a pair of retainers positioned on both sides of the conductive teeth,
    wherein the conductive teeth pierce through the conductive strip of the separated region from the rear surface of the flexible circuit belt, and tips of the conductive teeth sticking out of the top surface of the separated region are bent so as to pierce again into the conductive strip from the top surface of the separated region, while the pair of bendable retainers hold the separated region without touching the conductive strip, and
    wherein the flexible circuit belt is folded back at the attached connection terminals.

2. The branch connection structure of claim 1, wherein each retainer has a pair of opposed walls fit into the slits defining the associated separated region, and top ends of the walls are bent so as to press the top surface of the separated region of the flexible circuit belt.

3. The branch connection structure of claim 2, wherein the conductive teeth face each other and a gap between the face-to-face teeth is narrower than a gap between the opposing walls of the retainer.

4. The branch connection structure of claim 1, wherein the connection terminal has a contact at its leading end, and the pair of retainers and the conductive teeth are located behind the contact.

5. The branch connection structure of claim 4, wherein the contact is a female-type contact.

6. The branch connection structure of claim 1, wherein the flexible circuit belt is a flexible flat cable or a flexible printed circuit.

7. A branch connection structure comprising:
    a flexible circuit belt having a plurality of conductive strips arranged in parallel to each other at a predetermined interval, a pair of insulating films sandwiching the conductive strips, and a plurality of slits extending between any two adjacent conductive strips and along middle portions of the conductive strips, the flexible circuit belt being folded in double at a middle of the slits so that the slits define a plurality of doubled branch regions, each region including double conductive strip; and
    a plurality of connection terminals, each attached to one of the branch region, each connection terminal having conductive teeth and a pair of retainers positioned on both sides of the conductive teeth,
    wherein the conductive teeth pierce through the double conductive strip from the rear face of the branch region, and tips of the conductive teeth sticking out of the top surface of the branch region are bent so as to pierce again into the conductive strip from the top surface of the branch region, and wherein each retainer has a pair of opposing walls piercing through the insulating films of the doubled branch region, and top ends of the walls are bent so as to press the top surface of the branch region.

8. The branch connection structure of claim 7, wherein the conductive teeth face each other and the gap between the opposing teeth is narrower than the gap between the opposing walls of the retainer.

9. The branch connection structure of claim 7, further comprising a connector housing having a plurality of cavities, wherein each branch region and the connection terminal attached to the branch region constitute a branch terminal, each branch terminal being accommodated in one of the cavities of the connector housing.

10. The branch connection structure of claim 7, wherein the connection terminal has a contact at its leading end, and the pair of retainers and the conductive teeth are located behind the contact.

11. The branch connection structure of claim 10, wherein the contact is a female-type contact.

12. The branch connection structure of claim 7, wherein the flexible circuit belt is a flexible flat cable or a flexible printed circuit.

* * * * *